United States Patent
Kasai

(10) Patent No.: US 9,897,768 B2
(45) Date of Patent: Feb. 20, 2018

(54) OPTICAL FIBER MODULE

(71) Applicant: Fujikura Ltd., Tokyo (JP)

(72) Inventor: Yohei Kasai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/432,070

(22) Filed: Feb. 14, 2017

(65) Prior Publication Data

US 2017/0153400 A1 Jun. 1, 2017

Related U.S. Application Data

(63) Continuation of application No. PCT/JP2015/065978, filed on Jun. 3, 2015.

(30) Foreign Application Priority Data

Sep. 29, 2014 (JP) .................................. 2014-197787

(51) Int. Cl.
G02B 6/42 (2006.01)
G02B 6/32 (2006.01)
(Continued)

(52) U.S. Cl.
CPC ................ *G02B 6/42* (2013.01); *G02B 6/32* (2013.01); *G02B 6/4269* (2013.01);
(Continued)

(58) Field of Classification Search
CPC .......... G02B 6/42; G02B 6/32; G02B 6/4269; H01S 5/0071; H01S 5/02236; H01S 5/02284; H01S 5/024
See application file for complete search history.

(56) References Cited

U.S. PATENT DOCUMENTS

| | | | |
|---|---|---|---|
| 6,865,316 B1 * | 3/2005 | Pratt | G02B 6/4296 385/27 |
| 7,010,204 B2 * | 3/2006 | Reith | G02B 6/03627 385/128 |

(Continued)

FOREIGN PATENT DOCUMENTS

| | | |
|---|---|---|
| CN | 1326248 A | 12/2001 |
| CN | 101986179 A | 3/2011 |

(Continued)

OTHER PUBLICATIONS

International Search Report dated Jul. 21, 2015, issued in counterpart application No. PCT/JP2015/065978. (2 pages).
(Continued)

*Primary Examiner* — Peter Radkowski
(74) *Attorney, Agent, or Firm* — Westerman, Hattori, Daniels & Adrian, LLP

(57) ABSTRACT

An optical fiber module has a package housing having an internal space defined by a base plate, a side wall, and a cover member, a laser device disposed on the base plate within the internal space, an optical fiber that transmits a laser beam emitted from the laser device to an outside of the package housing, a light scattering member that scatters light having a wavelength of the laser beam and covers an outer circumferential surface of the projecting end of the optical fiber, and a heat dissipation portion disposed on the base plate. The optical fiber has a projecting end projecting from an inner surface of the side wall toward the internal space. The heat dissipation portion covers a portion of an outer circumferential surface of the light scattering member and exposes another portion of the outer circumferential surface of the light scattering member to the internal space.

14 Claims, 12 Drawing Sheets

(51) Int. Cl.
*H01S 5/00* (2006.01)
*H01S 5/022* (2006.01)
*H01S 5/024* (2006.01)

(52) U.S. Cl.
CPC ........ *H01S 5/0071* (2013.01); *H01S 5/02236* (2013.01); *H01S 5/02284* (2013.01); *H01S 5/02438* (2013.01); *H01S 5/02216* (2013.01); *H01S 5/02469* (2013.01)

(56) References Cited

U.S. PATENT DOCUMENTS

| | | | |
|---|---|---|---|
| 7,215,860 B2 * | 5/2007 | Engelberth | G02B 6/02 385/127 |
| 7,349,596 B2 * | 3/2008 | Anderegg | G02B 6/26 385/27 |
| 7,437,046 B2 * | 10/2008 | DiGiovanni | G02B 6/0365 385/126 |
| 7,551,823 B2 * | 6/2009 | Reith | G02B 6/03627 385/123 |
| 7,760,978 B2 * | 7/2010 | DiGiovanni | G02B 6/0365 385/126 |
| 7,787,733 B2 * | 8/2010 | DiGiovanni | G02B 6/0365 385/126 |
| 8,027,555 B1 | 9/2011 | Kliner et al. | |
| 8,811,789 B2 * | 8/2014 | Reith | G02B 6/03627 385/126 |
| 9,547,121 B2 * | 1/2017 | Hou | H01S 3/094007 |
| 9,574,759 B2 * | 2/2017 | Nemeyer | H01S 5/00 |
| 2001/0000621 A1 | 5/2001 | Mitsuda et al. | |
| 2001/0033719 A1 | 10/2001 | Mitsuda et al. | |
| 2002/0005522 A1 | 1/2002 | Miyokawa et al. | |
| 2004/0175086 A1 * | 9/2004 | Reith | G02B 6/03627 385/128 |
| 2006/0062532 A1 * | 3/2006 | Reith | G02B 6/03627 385/123 |
| 2006/0245707 A1 * | 11/2006 | Engelberth | G02B 6/02 385/127 |
| 2007/0217738 A1 * | 9/2007 | Anderegg | G02B 6/26 385/29 |
| 2009/0238526 A1 * | 9/2009 | Reith | G02B 6/03627 385/128 |
| 2011/0026877 A1 | 2/2011 | Yalamanchili et al. | |
| 2013/0022067 A1 * | 1/2013 | Sakamoto | G02B 6/4238 372/34 |
| 2014/0211818 A1 * | 7/2014 | Hou | H01S 3/094007 372/6 |
| 2015/0349481 A1 * | 12/2015 | Kliner | H01S 3/0675 359/341.3 |
| 2016/0208988 A1 * | 7/2016 | Nemeyer | H01S 5/00 |

FOREIGN PATENT DOCUMENTS

| | | |
|---|---|---|
| EP | 2 479 594 A1 | 7/2012 |
| JP | 11-248978 A | 9/1999 |
| JP | 2010-073758 A | 4/2010 |
| JP | 2012-14173 A | 1/2012 |
| JP | 2012-70007 A | 4/2012 |
| JP | 5226856 B1 | 7/2013 |
| JP | 2013-257362 A | 12/2013 |

OTHER PUBLICATIONS

Decision to Grant a Patent dated Oct. 20, 2015, issued in counterpart Japanese Patent Application No. 2014-197787, w/English translation (6 pages).
Notification of Reason for Refusal dated Jul. 14, 2015, issued in counterpart Japanese Patent Application No. 2014-197787, w/English translation (7 pages).
Extended Search Report dated Nov. 30, 2017, issued in counterpart European Application No. 15846795.1 (8 pages).
Office Action dated Oct. 23, 2017, issued in counterpart Chinese Application No. 201580047132.2, with English translation (10 pages).

\* cited by examiner

OPTICAL FIBER MODULE

TECHNICAL FIELD

The present invention relates to an optical fiber module, and more particularly to an optical fiber module operable to output a laser beam emitted from a laser device to an outside thereof.

BACKGROUND ART

When a laser beam emitted from a laser device of an optical fiber laser module enters an optical fiber, part of the laser beam that has been incident on the optical fiber with an angle of incidence that is greater than the maximum acceptance angle of the optical fiber is not totally internally reflected at an interface between a core and a cladding, resulting in leakage light, which does not propagate within the optical fiber. Furthermore, when an optical axis of a laser beam is deviated, light may not enter a core of an optical fiber. Such light results in leakage light. The intensity of such leakage light increases as a laser has a higher output. Heat generated from the leakage light may damage a covering of an optical fiber, an adhesive for fixing the optical fiber, or the like.

Therefore, such leakage light should be treated in a proper manner. However, it is dangerous to emit leakage light directly to an outside of an optical fiber module. Thus, the leakage light should be converted into heat and then released into the outside of the optical fiber module. In a conventional optical fiber module, there has been proposed that, for example, a bottom of a fiber holder for holding an optical fiber is located on the same plane as a bottom of a base plate of a housing so that the fiber holder is brought into direct contact with a heat sink (see, e.g., Patent Literature 1). With this configuration, a heat dissipation path for heat generated in the fiber holder can be shortened. Therefore, the heat dissipation efficiency of the optical fiber module can be improved, and a temperature increase can be prevented near a portion of the optical fiber where a laser beam is optically coupled to the optical fiber (hereinafter referred to as a laser coupling portion). With this configuration, however, most part of leakage light is confined in the fiber holder and converted into heat therein. Recent development in increasing the power of an optical fiber laser module has caused an increased amount of heat generated in a fiber holder. Thus, generated heat may result in a temperature higher than the heat resistance temperature of an adhesive used for fixing an optical fiber to the fiber holder. Accordingly, the adhesive may be ignited or damaged by fire.

Furthermore, there has also been proposed to scatter a laser beam that has been incident on an optical fiber with an angle of incidence that is greater than the maximum acceptance angle of the optical fiber, with use of a light scattering member within a housing to release the leakage light as scattered light into an interior of the housing (see, e.g., Patent Literature 2). This configuration can reduce the power of light converted into heat near a laser coupling portion and prevent a temperature increase near the laser coupling portion. With this configuration, however, most part of light scattered in a forward direction from the light scattering member is directed to the inside of a fiber holder for holding an optical fiber and is thus converted into heat within the fiber holder. Accordingly, this configuration also suffers from the same problems as the configuration disclosed in Patent Literature 1.

PRIOR ART LITERATURE

Patent Literature

Patent Literature 1: JP 5226856 B1
Patent Literature 2: JP 2013-257362 A

SUMMARY OF THE INVENTION

Problem(s) to be Solved by the Invention

The present invention has been made in view of the above drawbacks in the prior art. It is, therefore, an object of the present invention to provide an optical fiber module that can effectively convert leakage light generated within an optical fiber into heat, dissipate the heat into an outside of the optical fiber module, and prevent an adhesive for fixing the optical fiber or the like from being ignited or damaged by fire.

Means for Solving Problem(s)

According to an aspect of the present invention, there is provided an optical fiber module that can effectively convert leakage light generated within an optical fiber into heat, dissipate the heat into an outside of the optical fiber module, and prevent an adhesive for fixing the optical fiber or the like from being ignited or damaged by fire. This optical fiber module has a package housing having an internal space defined by a base plate, a side wall, and a cover member, a laser device disposed on the base plate within the internal space, an optical fiber that transmits a laser beam emitted from the laser device to an outside of the package housing, a light scattering member that scatters light having a wavelength of the laser beam, and a heat dissipation portion disposed on the base plate. The optical fiber has a projecting end that projects from an inner surface of the side wall of the package housing toward the internal space. The light scattering member covers an outer circumferential surface of the projecting end of the optical fiber. The heat dissipation portion covers a first portion of an outer circumferential surface of the light scattering member and exposes a second portion of the outer circumferential surface of the light scattering member to the internal space.

With this configuration, leakage light generated within the optical fiber is scattered by the light scattering member. Since the second portion of the outer circumferential surface of the light scattering member is exposed to the internal space, part of the leakage light is scattered into the internal space from the light scattering member. The scattered light is applied to a wide area of an inner surface of the package housing and absorbed therein. Therefore, the density of heat converted into heat can be lowered. Furthermore, a portion of the leakage light is absorbed in the light scattering member and converted into heat therein. Since the first part of the outer circumferential surface of the light scattering member is covered with the heat dissipation portion, heat generated in the light scattering member can be transferred to the base plate through the heat dissipation portion and thus dissipated to an outside of the optical fiber module. Furthermore, a portion of the leakage light propagating in a forward direction is converted into heat by the light scattering member, and the converted heat is transferred to the base plate through the heat dissipation portion. Therefore, it is possible to reduce the amount of leakage light that reaches a fiber holder for holding an optical fiber that is located forward from the heat dissipation portion. Accordingly, an adhesive used for the fiber holder or the like can be prevented from being ignited or damaged by fire. In this manner, according to the present invention, leakage light generated within an optical fiber can effectively be transferred to heat, and an adhesive for fixing an optical fiber can be prevented from being ignited or damaged by fire.

The second portion of the outer circumferential surface of the light scattering member may be exposed to the cover member of the package housing. For example, a lower half of the light scattering member may be covered with the heat dissipation portion, and an upper half of the light scattering member may be exposed to the cover member.

Furthermore, the optical fiber module may further have at least one reflection portion that reflects light scattered from the light scattering member. In this case, it is preferable to configure the reflection portion to reflect the light scattered from the light scattering member toward the base plate of the package housing. With such a reflection portion, light scattered into the internal space from the light scattering member can be reflected toward the base plate of the package housing. Therefore, the scattered light can be converted into heat with the base plate and dissipated to an outside of the optical fiber module.

The center of the reflection portion in an axial direction of the optical fiber and the center of an end surface of the projecting end of the optical fiber are preferably on a common line perpendicular to the axial direction of the optical fiber. Thus, when the center of the reflection portion in the axial direction of the optical fiber is aligned with the center of the end surface of the projecting end of the optical fiber, the maximum amount of light scattered into the internal space from the light scattering member can be reflected by the reflection portion.

Furthermore, at least one cross-section of the reflection portion preferably has a bilateral symmetrical shape with respect to an axis that passes through the center of an end surface of the projecting end of the optical fiber and extends along a direction perpendicular to the axial direction of the optical fiber. When at least one cross-section of the reflection portion has a bilateral symmetrical shape with respect to the aforementioned axis, light scattered into the internal space can be equally reflected by the reflection portion. Thus, uniform heat dissipation can be achieved.

Moreover, the optical fiber module may further have at least one absorption portion that absorbs light reflected by the reflection portion. With this configuration, light reflected by the reflection portion is absorbed by the absorption portion and converted into heat therein. Therefore, light reflected by the reflection portion can efficiently be converted into heat.

The second portion of the outer circumferential surface of the light scattering member may be exposed to the base plate of the package housing. For example, the heat dissipation portion may include a holder that holds the light scattering member and a connection portion that connects the holder and the base plate to each other. A portion of the outer circumferential surface of the light scattering member may be covered with the holder on a side of the cover member, and the second portion of the outer circumferential surface of the light scattering member may be exposed on a side of the base plate to the base plate.

Furthermore, the optical fiber module may further have at least one absorption portion that absorbs light scattered from the light scattering member. With this configuration, light scattered from the light scattering member is absorbed by the absorption portion and converted into heat therein. Therefore, light scattered from the light scattering member can more efficiently be converted into heat.

The heat dissipation portion may project from the end surface of the projecting end toward the internal space in a direction in which the optical fiber extends by at least a length L that meets the following equation (1):

$$L = \left(\frac{\phi_2 - \phi_1}{2}\right)\frac{1}{\tan\theta_{max}} \quad (1)$$

where $\phi_1$ is a diameter of a core of the optical fiber, $\phi_2$ is a diameter of the light scattering member, and $\theta_{max}$ is a maximum acceptance angle of the optical fiber.

With this configuration, a portion of the laser beam directed to the optical fiber with an angle of incidence that is greater than the maximum acceptance angle $\theta_{max}$ of the optical fiber can be applied to a side surface of the heat dissipation portion, converted into heat therein, and thus prevented from entering the optical fiber. Accordingly, the amount of leakage light generated within the optical fiber can be reduced.

When the base plate is connected to a heat sink, more efficient dissipation can be achieved.

Advantageous Effects of the Invention

According to the present invention, leakage light generated within an optical fiber is scattered into an internal space from a light scattering member and converted into heat by the light scattering member. The heat is transferred to the heat dissipation portion. Thus, the leakage light can effectively be converted into heat and released into an outside of an optical fiber module. Furthermore, a portion of leakage light that propagates in a forward direction can be converted into heat by the light scattering member. The converted heat is transferred to the base plate through the heat dissipation portion. Therefore, it is possible to reduce the amount of leakage light that reaches a fiber holder for holding an optical fiber that is located forward from the heat dissipation portion. Accordingly, an adhesive used in the fiber holder or the like can be prevented from being ignited or damaged by fire.

MODE(S) FOR CARRYING OUT THE INVENTION

Figure 1:
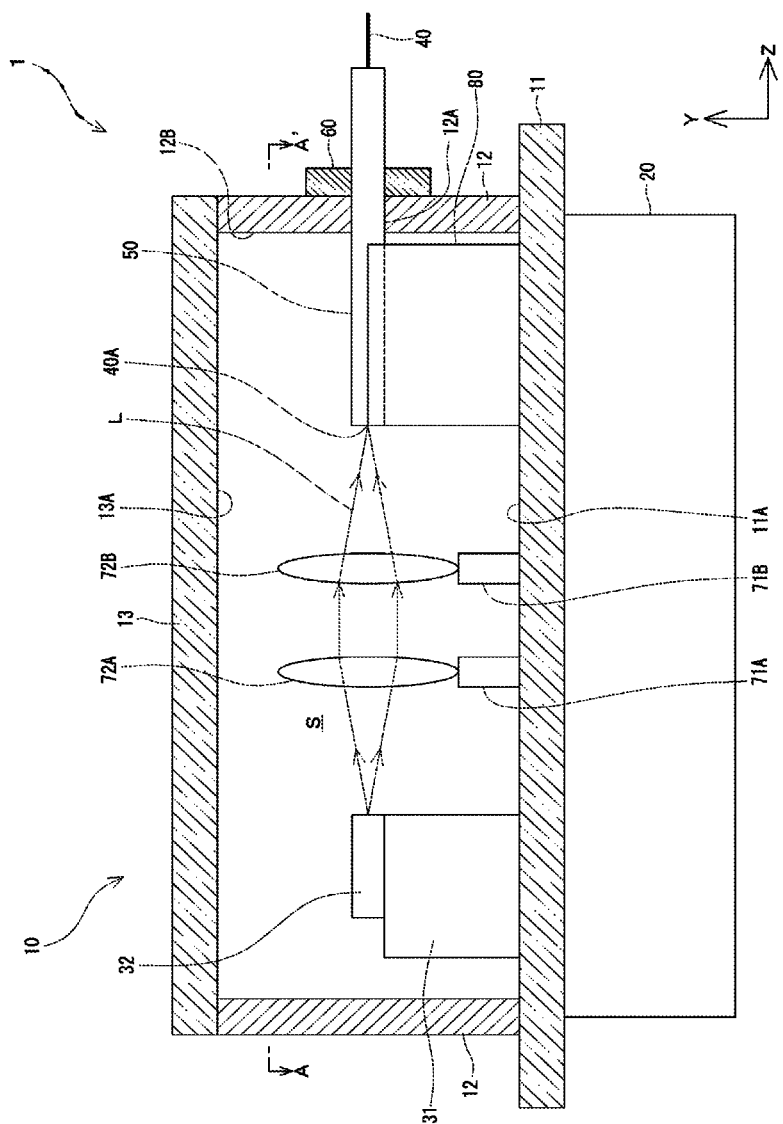
FIG. 1 is a cross-sectional view schematically showing an optical fiber module according to a first embodiment of the present invention.

Embodiments of an optical fiber module according to the present invention will be described in detail below with reference to FIGS. 1 to 12. In FIGS. 1 to 12, the same or corresponding components are denoted by the same or corresponding reference numerals and will not be described below repetitively.

Figure 2:
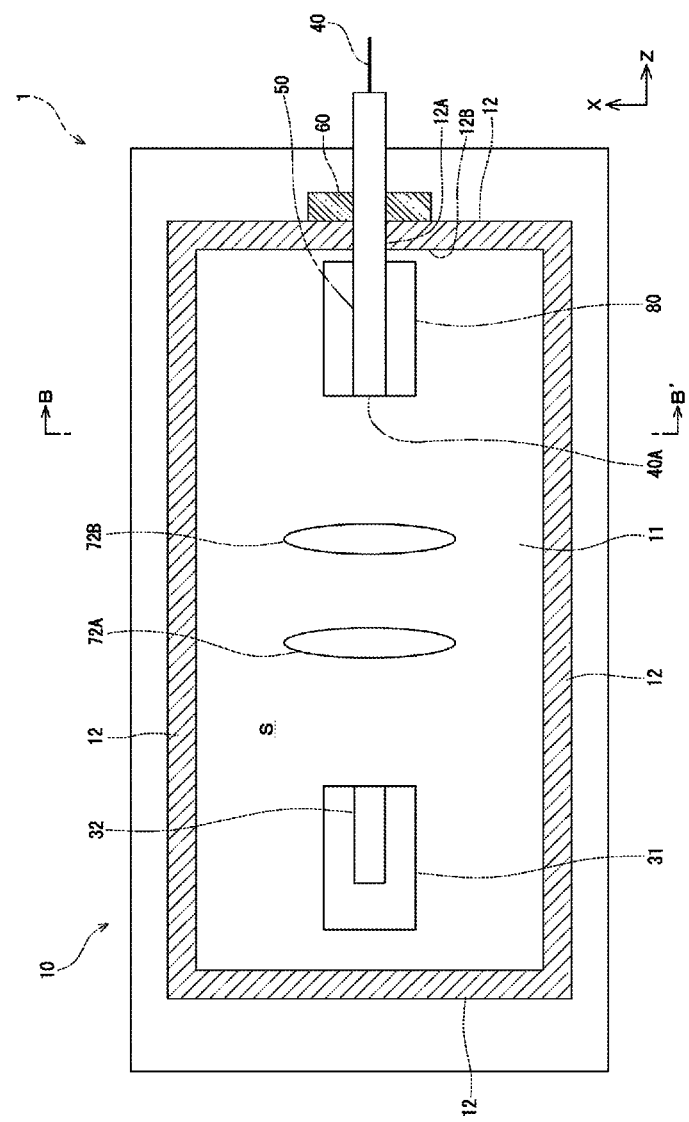
FIG. 2 is a cross-sectional view taken along line A-A' of FIG. 1.
Figure 3:
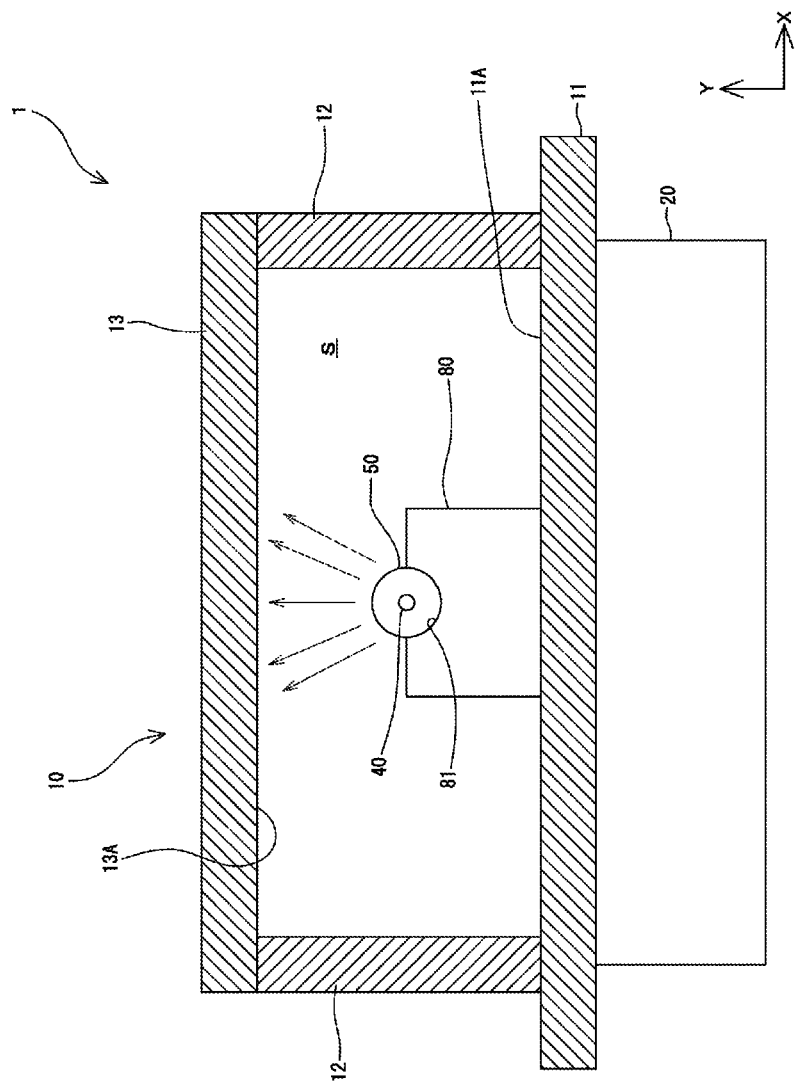
FIG. 3 is a cross-sectional view taken along line B-B' of FIG. 2.

FIG. 1 is a cross-sectional view schematically showing an optical fiber module 1 according to a first embodiment of the present invention, FIG. 2 is a cross-sectional view taken along line A-A' of FIG. 1, and FIG. 3 is a cross-sectional view taken along line B-B' of FIG. 2. As shown in FIGS. 1 to 3, the optical fiber module 1 according to the present embodiment has a package housing 10 including a base plate 11, a side wall 12 provided on the base plate 11, and a cover member 13 that covers an upper side of the side wall 12. Furthermore, a heat sink 20 is connected to a lower surface of the base plate 11 so that heat of the base plate 11 is dissipated to an outside of the optical fiber module 1 through the heat sink 20.

As shown in FIGS. 1 to 3, the aforementioned base plate 11, side wall 12, and cover member 13 jointly form an internal space S within the package housing 10. A mount 31 is disposed on an upper surface 11A of the base plate 11 within the internal space S. A high-power semiconductor laser device 32 is mounted on the mount 31. For example, a high-power laser diode of 10 W to 100 W may be used for the semiconductor laser device 32.

Furthermore, the optical fiber module 1 has an optical fiber 40 operable to transmit a laser beam L emitted from the semiconductor laser device 32 to an outside of the package housing 10 and a light scattering member 50 that covers an outer circumferential surface of an end of the optical fiber 40. The optical fiber 40 and the light scattering member 50 are held within a fiber holder 60 fixed on the side wall 12 of the package housing 10 and introduced into the internal space S through a through hole 12A formed in the side wall 12.

Moreover, two lens support portions 71A and 71B are provided on the upper surface 11A of the base plate 11 within the internal space S of the package housing 10. Lenses 72A and 72B are mounted on those lens support portions 71A and 71B, respectively. As shown FIG. 1, those lenses 72A and 72B focus the laser beam L emitted from the semiconductor laser device 32 onto an end surface 40A of the end of the optical fiber 40.

Here, the light scattering member 50 is formed of a material that scatters light having a wavelength of the laser beam emitted from the semiconductor laser device 32. Furthermore, it is preferable to form the light scattering member 50 of a material that absorbs light having a wavelength of the laser beam as little as possible. Examples of such materials for the light scattering member 50 include ceramics such as zirconia, aluminum nitride, and alumina and crystallized glass.

The optical fiber 40 projects from an inner surface 12B of the side wall 12 into the internal space S. An outer circumferential surface of the projecting portion of the optical fiber 40 (projecting end) is covered with the aforementioned light scattering member 50. In FIG. 3, the light scattering member 50 is illustrated as a cylindrical member. Nevertheless, the shape of the light scattering member 50 is not limited to the cylindrical shape.

Furthermore, as shown in FIGS. 1 to 3, a portion of the outer circumferential surface of the light scattering member 50 (a first portion; a lower half in the example shown in FIG. 3) is covered with a heat dissipation portion 80 provided on the upper surface 11A of the base plate 11. This heat dissipation portion 80 extends along the Z-direction from the vicinity of the inner surface 12B of the side wall 12 of the package housing 10 to the end surface 40A of the projecting end of the optical fiber 40. A bottom of the heat dissipation portion 80 is connected to and fixed to the upper surface 11A of the base plate 11. This heat dissipation portion 80 should preferably have a high thermal conductivity because it serves to release heat generated in the light scattering member 50 into the base plate 11. Furthermore, the heat dissipation portion 80 should preferably have a high reflectance so as to reflect scattered light incident on an outer circumferential surface of the heat dissipation portion 80. For example, the outer circumferential surface of the heat dissipation portion 80 may be plated with gold in order to increase the reflectance of the heat dissipation portion 80. For example, the heat dissipation portion 80 may be formed of a metal such as copper, aluminum, iron, and Kovar, aluminum nitride, or silicon carbide.

As shown in FIG. 3, a groove 81 having a semicircular cross-section is formed near the central portion of an upper surface of the heat dissipation portion 80 along the X-direction. This groove 81 extends through the overall length of the heat dissipation portion 80 along the Z-direction. A lower half of the light scattering member 50 is received within the groove 81. Thus, the heat dissipation portion 80 covers the lower half of the outer circumferential surface of the light scattering member 50 and also holds the light scattering member 50 within the groove 81 so that an upper half (second portion) of the light scattering member 50 is exposed to a lower surface 13A of the cover member 13.

For example, the light scattering member 50 and the heat dissipation portion 80 may be bonded to each other by an adhesive agent such as thermosetting resin. Alternatively, a portion of the light scattering member 50 may be metalized, and the light scattering member 50 may be fixed into the groove 81 of the heat dissipation portion 80 by soldering. Furthermore, the light scattering member 50 may be fitted and fixed into the aforementioned groove 81. The cross-sectional shape of the groove 81 may not necessarily be semicircular and may be varied depending upon the shape of the outer circumferential surface of the light scattering member 50.

Figure 4:
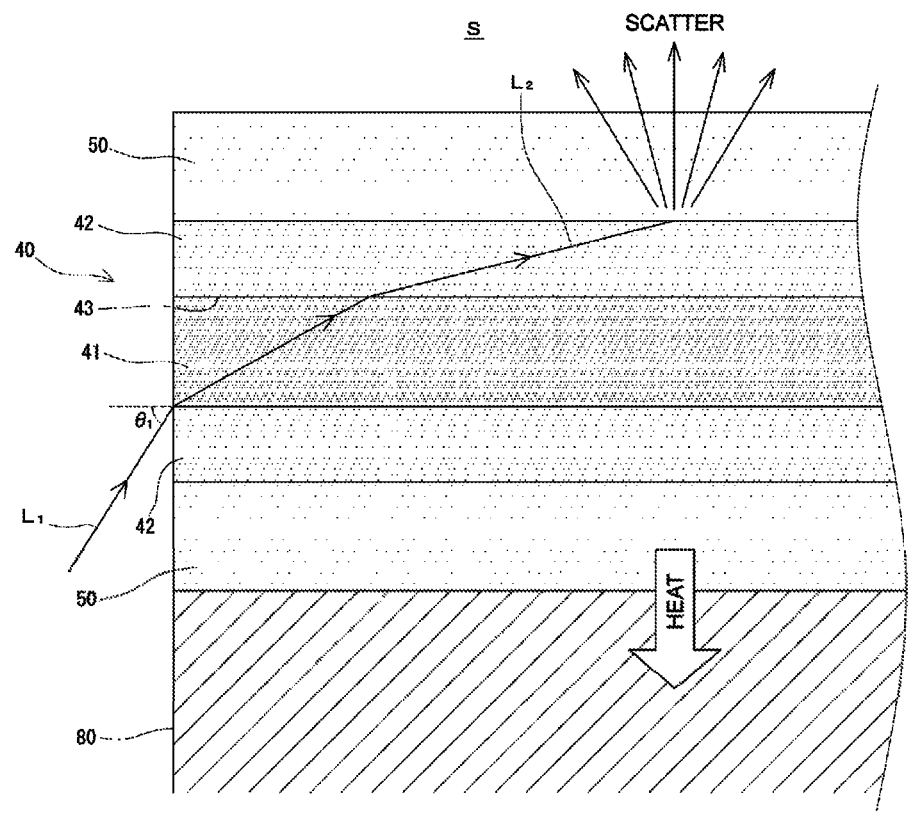
FIG. 4 is a schematic diagram showing an optical path of a laser beam that has been incident on an optical fiber with an angle of incidence that is greater than the maximum acceptance angle of the optical fiber in the optical fiber module shown in FIG. 1.

FIG. 4 is a schematic diagram showing an optical path of a laser beam $L_1$ that has been incident on the optical fiber 40 with an angle of incidence $\theta_1$ that is greater than the maximum acceptance angle $\theta_{max}$ of the optical fiber 40. As shown in FIG. 4, the optical fiber 40 includes a core 41 and a cladding 42. The laser beam $L_1$ that has been incident on the core 41 with an angle of incidence $\theta_1$ is not totally internally reflected at an interface 43 between the core 41 and the cladding 42, then introduced into the cladding 42, and transmitted as leakage light $L_2$ within the cladding 42. This leakage light $L_2$ reaches the light scattering member 50, which covers the outer circumferential surface of the cladding 42. Thus, the leakage light $L_2$ is scattered from the light scattering member 50.

In the present embodiment, as described above, the upper half of the light scattering member 50 is exposed to the internal space S. Therefore, the leakage light $L_2$ that has reached the upper half of the light scattering member 50 is scattered from the light scattering member 50 into the internal space S (see FIG. 4). Thus, a portion of the leakage light is scattered into the internal space S from the light scattering member 50. Therefore, the scattered light can be applied to a wide area of the inner surface of the package housing 10. Accordingly, it is possible to reduce an optical power per area that is absorbed in the package housing 10 and converted to heat. In this manner, a portion of the leakage light can be converted into heat while local heat generation is suppressed.

Meanwhile, the lower half of the light scattering member 50 is covered with the heat dissipation portion 80 as described above. A fraction of the leakage light that has reached the lower half of the light scattering member 50 is absorbed by the light scattering member 50 and converted into heat therein. Heat generated in the light scattering member 50 is transferred to the base plate 11 through the heat dissipation portion 80 (see FIG. 4) and dissipated to an outside of the optical fiber module 1 from the heat sink 20 connected to the base plate 11. At that time, a portion of the leakage light that propagates in a forward direction is also converted into heat, which is then transferred to the base plate 11 through the heat dissipation portion 80. Therefore, the amount of the leakage light that reaches the fiber holder 60, which is located forward from the heat dissipation portion 80, can be reduced so as to prevent an adhesive used for the fiber holder 60 or the like from being ignited or damaged by fire.

Without the heat sink 20, heat absorbed by the heat dissipation portion 80 can be dissipated through the base plate 11. Nevertheless, it is preferable to connect the heat sink 20 to the base plate 11 in order to enhance the heat dissipation efficiency.

Thus, according to the present embodiment, a portion of the leakage light can be scattered into the internal space S from the light scattering member 50 and converted into heat in the package housing 10. At the same time, another portion of the leakage light can be converted into heat by the light scattering member 50, and the heat can be transferred to the base plate 11 through the heat dissipation portion 80. Accordingly, the leakage light generated within the optical fiber 40 can efficiently be converted into heat and released to the outside of the package housing 10. Furthermore, a portion of the leakage light that propagates in a forward direction is converted into heat and released to the outside of the package housing 10. Therefore, the amount of the leakage light that reaches the fiber holder 60 can be reduced so as to prevent an adhesive used for the fiber holder 60 or the like from being ignited or damaged by fire.

Figure 5:
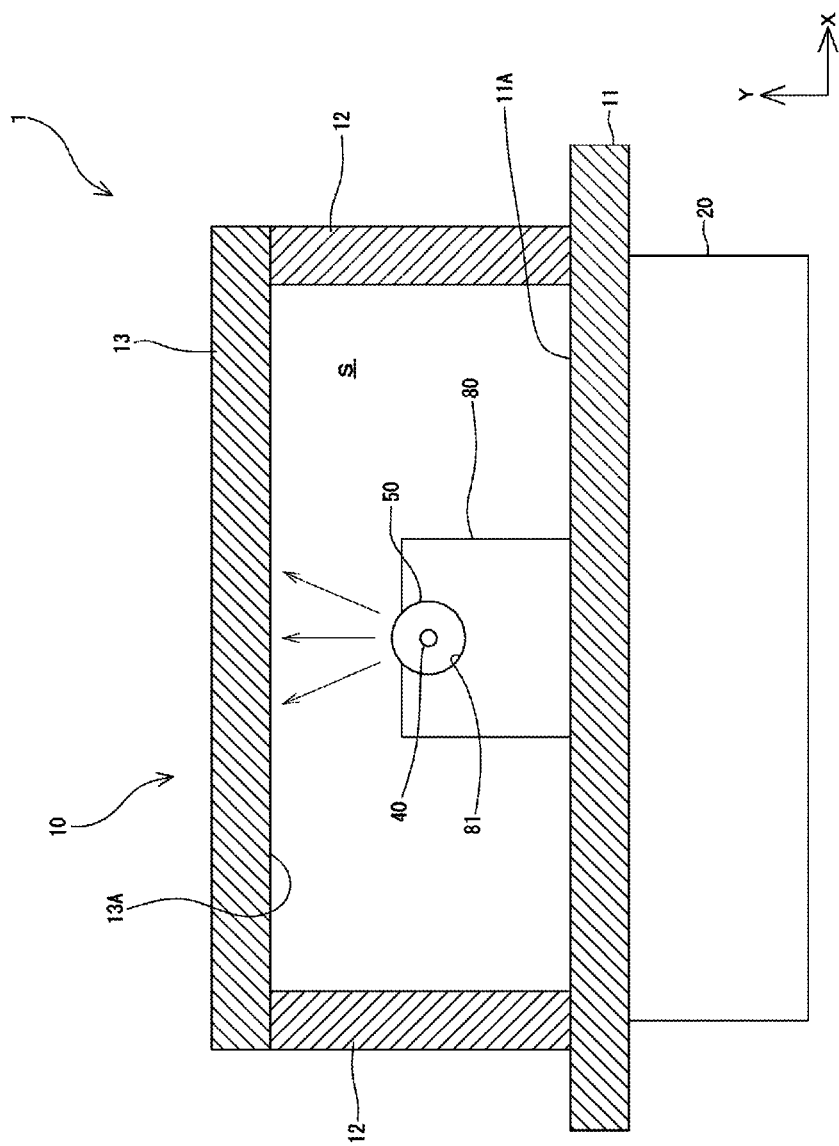
FIG. 5 is a schematic diagram showing another example of a heat dissipation portion in the optical fiber module shown in FIG. 3.

In the present embodiment, the lower half of the outer circumferential surface of the light scattering member 50 is covered with the heat dissipation portion 80. However, any area of the light scattering member 50 may be covered with the heat dissipation portion 80 as long as the leakage light can be scattered into the internal space S. For example, as shown in FIG. 5, the light scattering member 50 may be covered with the heat dissipation portion 80 so that only an area less than a half of the outer circumferential surface of the light scattering member 50 is exposed to the cover member 13.

Meanwhile, the cover member 13 of the package housing 10 is not connected directly to the heat sink 20. Therefore, the heat dissipation performance of the cover member 13 is less than the heat dissipation performance of the base plate 11. Furthermore, an operator who handles the optical fiber module 1 may touch the cover member 13. If the cover member 13 is excessively heated, the operator who handles the optical fiber module 1 may get burnt. Accordingly, in a second embodiment of the present invention, which will be described below, a mechanism is provided for preventing the cover member 13 from being excessively heated.

Figure 6:
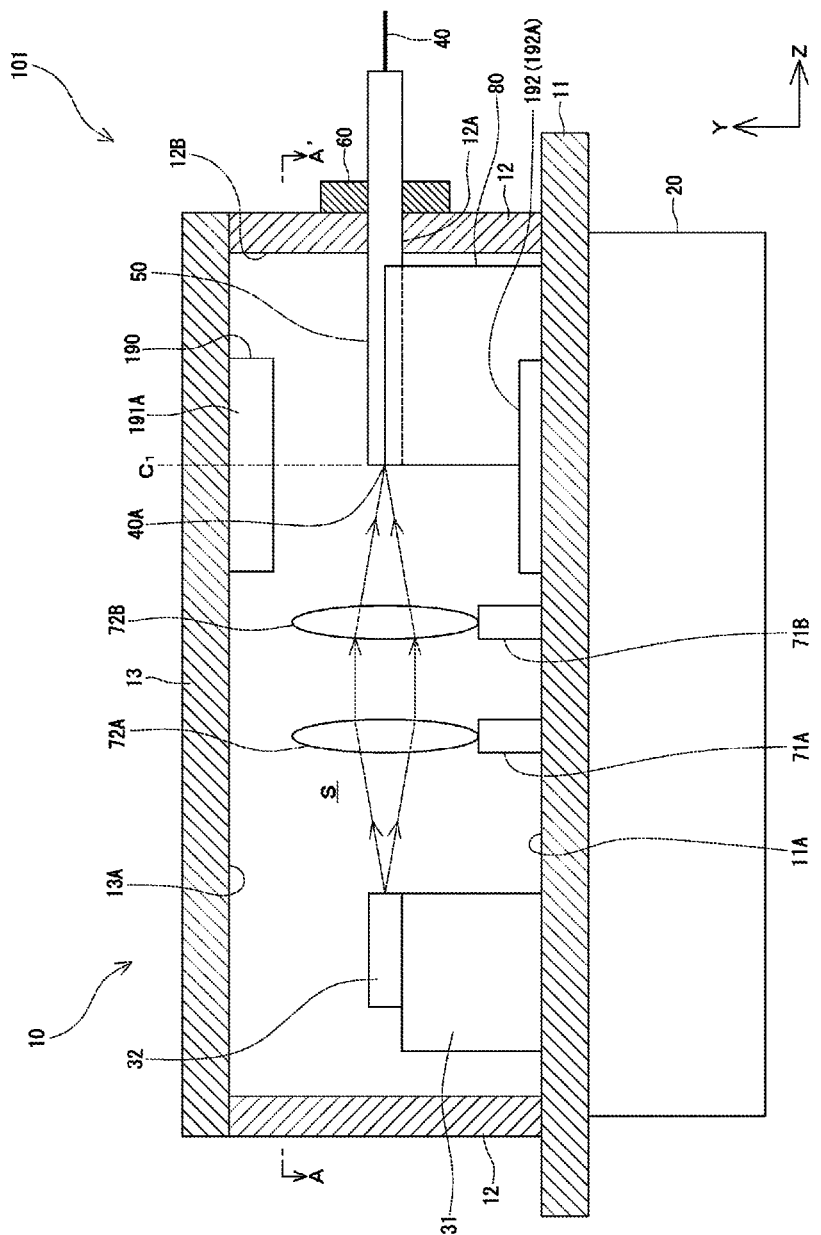
FIG. 6 is a cross-sectional view schematically showing an optical fiber module according to a second embodiment of the present invention.
Figure 7:
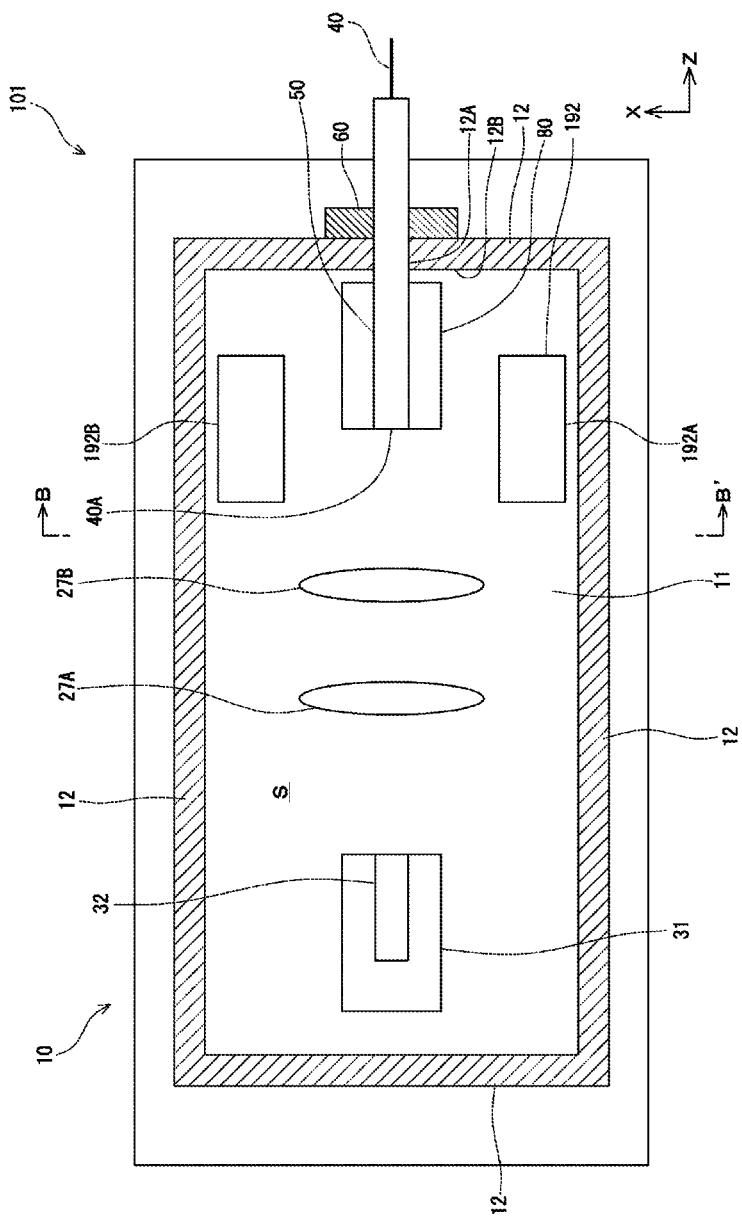
FIG. 7 is a cross-sectional view taken along line A-A' of FIG. 6.
Figure 8:
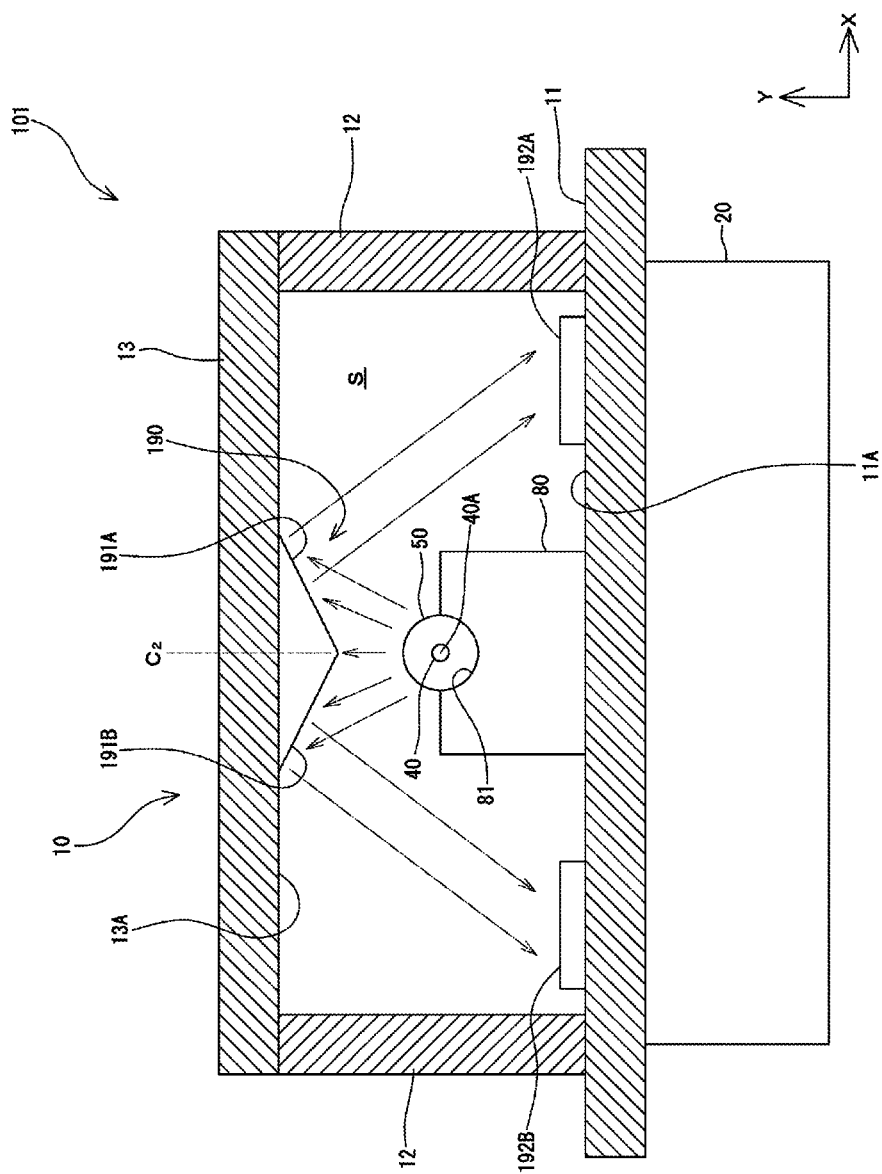
FIG. 8 is a cross-sectional view taken along line B-B' of FIG. 7.

FIG. 6 is a cross-sectional view schematically showing an optical fiber module 101 according to a second embodiment of the present invention, FIG. 7 is a cross-sectional view taken along line A-A' of FIG. 6, and FIG. 8 is a cross-sectional view taken along line B-B' of FIG. 7. As shown in FIGS. 6 to 8, the optical fiber module 101 of the present embodiment has a reflection portion 190 for reflecting light scattered from the light scattering member 50 and absorption portions 192 for absorbing light reflected from the reflection portion 190. Other components are the same as described in the aforementioned first embodiment.

As shown in FIGS. 6 and 8, the reflection portion 190 is provided on the lower surface 13A of the cover member 13 of the package housing 10 and configured to reflect light scattered from the light scattering member 50 toward the base plate 11. The reflectance of the reflection portion 190 to the scattered light is higher than the reflectance of the lower surface 13A of the cover member 13. For example, when the cover member 13 is formed of stainless, a dielectric multi-layer mirror or a gold mirror may be used for the reflection portion 190. With the reflection portion 190, light scattered into the internal space S from the upper half of the light scattering member 50 can be reflected toward the base plate 11.

The absorption portions 192 are provided on the upper surface 11A of the base plate 11 of the package housing 10. In the present embodiment, as shown in FIGS. 7 and 8, two absorption portions 192A and 192B are arranged on opposite sides of the heat dissipation portion 80 with respect to the axial direction of the optical fiber 40. For example, the absorption portions 192 may be formed of a metallic member such as iron or chromium, which has a relatively higher absorptance than general metals. Alternatively, the absorption portions 192 may be formed by black alumite processing conducted on a portion of the upper surface 11A of the base plate 11. The absorption portions 192 should preferably have a higher absorptance. A higher absorptance of the absorption portions 192 can promote absorption of light at the absorption portions 192 and prevent the scattered light from being applied to other components. Furthermore, a higher thermal conductivity of the absorption portions 192 can prevent heat from being retained in the absorption portions 192. Thus, the absorption portions 192 are prevented from being increased in temperature beyond its heat resistance temperature and being damaged by fire.

As shown in FIGS. 6 and 8, the reflection portion 190 of the present embodiment is in the form of a triangular prism having two reflective surfaces 191A and 191B. The reflection portion 190 is configured so that light scattered from the light scattering member 50 is reflected toward the absorption portions 192A and 192B, which are disposed on both sides of the heat dissipation portion 80, by the reflective surfaces 191A and 191B. Therefore, the scattered light from the light scattering member 50 is reflected by the reflective surfaces 191A and 191B of the reflection portion 190, absorbed by the absorption portions 192A and 192B, and converted into heat therein. The converted heat is transferred to the heat sink 20 through the base plate 11 and dissipated to an outside of the optical fiber module 101 through the heat sink 20.

Thus, in the present embodiment, leakage light that has reached the upper half of the light scattering member 50 is scattered into the internal space S from the light scattering member 50. Most part of the scattered light is reflected by the reflective surfaces 191A and 191B of the reflection portion 190 and applied to the absorption portions 192A and 192B provided on the upper surface 11A of the base plate 11. The scattered light applied to the absorption portions 192A and 192B is absorbed by the absorption portions 192A and 192B and converted into heat therein. The converted heat is transferred to the heat sink 20 through the base plate 11 and dissipated to the outside of the optical fiber module 101 through the heat sink 20. Thus, most part of the light scattered into the internal space S from the light scattering member 50 is absorbed by the absorption portions 192A and 192B. Accordingly, the cover member 13 is prevented from being excessively heated. Furthermore, since the scattered light is absorbed by the absorption portions 192A and 192B, components other than the absorption portions 192A and 192B that are disposed within the internal space S can be prevented from being thermally degraded by the scattered light or damaged by fire due to the scattered light.

Meanwhile, part of the leakage light that has reached the lower half of the light scattering member 50 is converted into heat by the light scattering member 50 as in the aforementioned first embodiment. The converted heat is transferred to the base plate 11 through the heat dissipation portion 80 and dissipated to the outside of the optical fiber module 101 through the heat sink 20.

As described above, the laser beam emitted from the semiconductor laser device 32 is focused onto the end surface 40A of the projecting end of the optical fiber 40. Therefore, the amount of leakage light generated within the optical fiber 40 is maximized near the end surface 40A. Accordingly, the amount of light scattered into the internal space S from the light scattering member 50 is also maximized near the end surface 40A of the projecting end of the optical fiber 40. In the present embodiment, as shown in FIG. 6, the center of the reflection portion 190 along the Z-direction is aligned with the center of the end surface 40A of the projecting end of the optical fiber 40, where the amount of scattered light is maximized. This configuration allows the reflection portion 190 to reflect the largest possible amount of light scattered into the internal space S from the light scattering member 50. In other words, the reflection portion 190 of the present embodiment is arranged such that the center of the reflection portion 190 along the Z-direction and the center of the end surface 40A of the projecting end of the optical fiber 40 are located on the common line $C_1$ extending along the Y-direction.

Furthermore, as shown in FIG. 8, the reflection portion 190 has a cross-sectional shape having an isosceles triangle on the XY plane. This cross-sectional shape is bilaterally symmetrical with respect to an axis $C_2$ that passes through the center of the end surface 40A of the projecting end of the optical fiber 40 and extends along the Y-direction. Therefore, light scattered into the internal space S from the light scattering member 50 is reflected equally toward the absorption portions 192A and 192B by the reflective surface 191A and the reflective surface 191B, which are disposed on opposite sides of the symmetry axis $C_2$, and converted into heat in the absorption portions 192A and 192B. Thus, since the cross-sectional shape of the reflection portion 190 on the XY plane is bilaterally symmetrical with respect to the axis $C_2$ passing through the center of the end surface 40A of the projecting end of the optical fiber 40 and extending along the Y-direction, the light scattered into the internal space S can be reflected equally to thereby achieve uniform heat dissipation.

The configuration to achieve uniform heat dissipation of the light scattered into the internal space S is not limited to the illustrated example. Uniform heat dissipation of the scattered light can be achieved as in the aforementioned example as long as at least one cross-section of the reflection portion 190 is bilaterally symmetrical with respect to an axis passing through the center of the end surface 40A of the projecting end of the optical fiber 40 and extending in a direction perpendicular to the axial direction of the optical fiber 40.

Furthermore, the shape and location of the reflection portion 190 are not limited to the illustrated example and may be varied appropriately as needed. For example, the reflection portion 190 may be in the form of a rectangular parallelepiped. Alternatively, the reflection portion 190 may be in the form of a sheet. Although one reflection portion 190 is provided in the present embodiment, a plurality of reflection portions 190 may be provided.

Moreover, the shape and location of the absorption portions 192 are not limited to the illustrated example and may be varied appropriately as needed. For example, the absorption portions 192 may be formed in any region of an inner surface of the side wall 12. When the heat sink 20 is connected to the base plate 11, it is preferable to form the absorption portions 192 on the upper surface 11A of the base plate 11, as in the present embodiment, for enhancing the heat dissipation efficiency. Although two absorption portions 192 are provided in the present embodiment, only one absorption portion 192 or a plurality of absorption portions 192 may be provided. Alternatively, the reflection portion 190 may apply the scattered light directly to the inner surface of the package housing 10 without any absorption portions 192.

Figure 9:
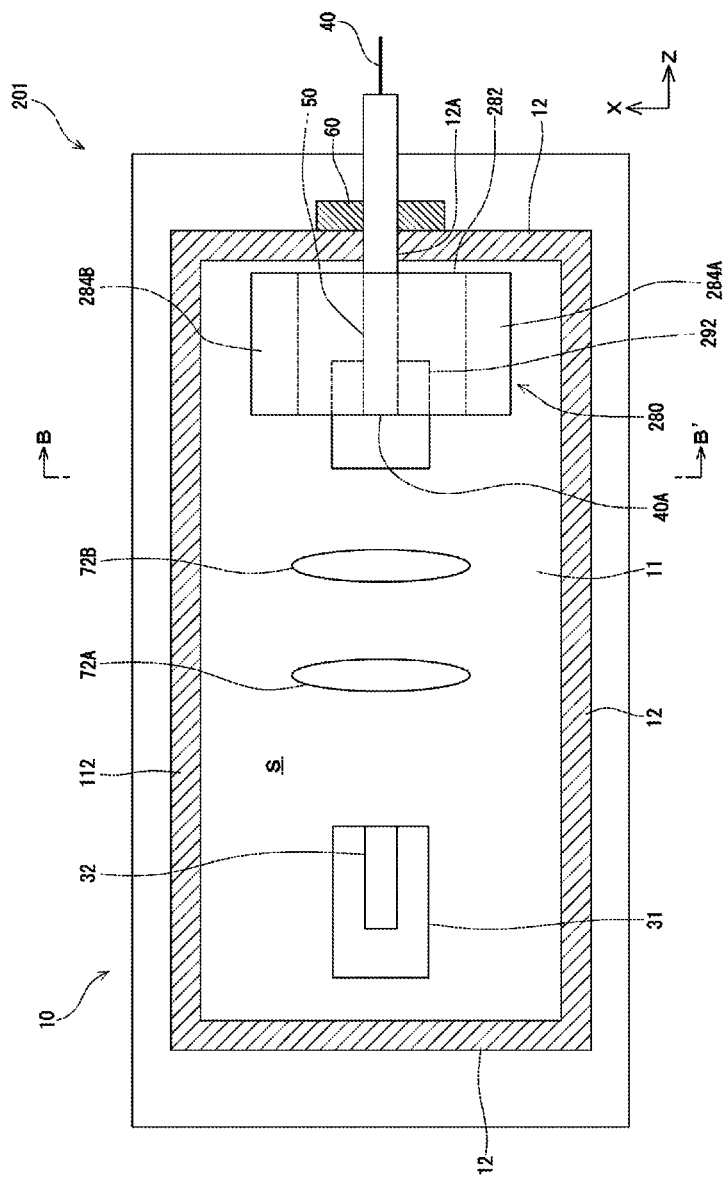
FIG. 9 is a cross-sectional view schematically showing an optical fiber module according to a third embodiment of the present invention.
Figure 10:
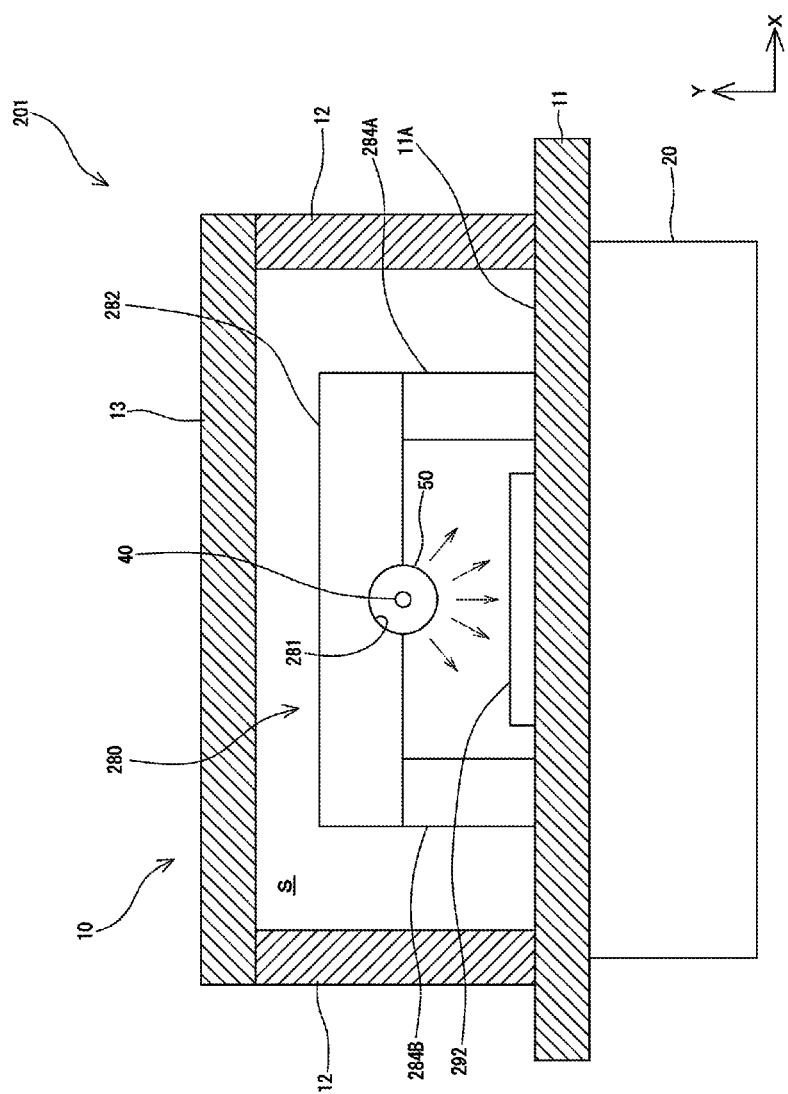
FIG. 10 is a cross-sectional view taken along line B-B' of FIG. 9.

FIG. 9 is a cross-sectional view schematically showing an optical fiber module 201 according to a third embodiment of the present invention, and FIG. 10 is a cross-sectional view taken along line B-B' of FIG. 9. As shown in FIGS. 9 and 10, the optical fiber module 201 of the present embodiment has a gate-like heat dissipation portion 280 disposed on the upper surface 11A of the base plate 11 and an absorption portion 292 that absorbs light scattered from the light scattering member 50.

As with the heat dissipation portion 80 of the first embodiment, the heat dissipation portion 280 should preferably have a high thermal conductivity. Furthermore, the heat dissipation portion 280 should preferably have a high reflectance so as to reflect scattered light incident on an outer circumferential surface of the heat dissipation portion 280. For example, the outer circumferential surface of the heat dissipation portion 80 may be plated with gold in order to increase the reflectance of the heat dissipation portion 280. For example, the heat dissipation portion 280 may be formed of a metal such as copper, aluminum, iron, and Kovar, aluminum nitride, or silicon carbide. For example, the absorption portion 292 may be formed of a metallic member such as iron or chromium, which has a relatively higher absorptance than general metals. Alternatively, the absorption portion 292 may be formed by black alumite processing conducted on a portion of the upper surface 11A of the base plate 11.

As shown in FIG. 10, the heat dissipation portion 280 has a holder 282 that holds the light scattering member 50 and two connection portions 284A and 284B connecting an edge of a lower surface of the holder 282 along the X-direction to the upper surface 11A of the base plate 11. A groove 281 having a semicircular cross-section is formed near the central portion of a lower surface of the holder 282 of the heat dissipation portion 280 along the X-direction. This groove 281 extends through the overall length of the holder 282 along the Z-direction. The upper half of the light scattering member 50 is received within the groove 281. Thus, the holder 282 of the heat dissipation portion 280 covers the upper half of the outer circumferential surface of the light scattering member 50 and also holds the light scattering member 50 within the groove 281 so that a lower half of the light scattering member 50 is exposed to the base plate 11.

For example, the light scattering member 50 and the holder 282 of the heat dissipation portion 280 may be bonded to each other by an adhesive agent such as thermosetting resin. Alternatively, a portion of the light scattering member 50 may be metalized, and the light scattering member 50 may be fixed into the groove 281 of the holder 282 by soldering. Furthermore, the light scattering member 50 may be fitted and fixed into the aforementioned groove 281. The cross-sectional shape of the groove 281 may not necessarily be semicircular and may be varied depending upon the shape of the outer circumferential surface of the light scattering member 50.

The absorption portion 292 is disposed between the two connection portions 284A and 284B on the upper surface 11A of the base plate 11. The absorption portion 292 is located below the light scattering member 50 held within the groove 281 in the holder 282 of the heat dissipation portion 280, so that light scattered from the light scattering member 50 is applied to the absorption portion 292. Accordingly, leakage light that has reached a lower half of the light scattering member 50 (a portion of the light scattering member 50 near the base plate 11) is scattered into the internal space S from the light scattering member 50, applied to the absorption portion 292, then absorbed by the absorption portion 292, and converted into heat therein. The converted heat is transferred to the heat sink 20 through the base plate 11 and dissipated to an outside of the optical fiber module 201 through the heat sink 20. In the present embodiment, since the scattered light is absorbed by the absorption portion 292, components other than the absorption portion 292 192B that are disposed within the internal space S can be prevented from being thermally degraded by the scattered light or damaged by fire due to the scattered light. In the present embodiment, the center of the absorption portion 292 along the Z-direction is aligned with the center of the end surface 40A of the projecting end of the optical fiber 40, where the amount of scattered light is maximized. This configuration allows the absorption portion 292 to absorb the largest possible amount of light scattered from the light scattering member 50. The light scattered from the light scattering member 50 may be applied directly to the upper surface 11A of the base plate 11 without any absorption portion 292.

Meanwhile, a fraction of the leakage light that has reached the upper half of the light scattering member 50 is absorbed by the light scattering member 50 and converted into heat therein. Heat generated in the light scattering member 50 is absorbed by the holder 282 of the heat dissipation portion 280, transferred to the base plate 11 through the connection portions 284A and 284B of the heat dissipation portion 280, further transferred to the heat sink 20, and dissipated to an outside of the optical fiber module 201 from the heat sink 20.

In the present embodiment, since the upper half of the light scattering member 50 (a portion of the light scattering member 50 near the cover member 13) is covered with the holder 282 of the heat dissipation portion 280, little scattered light is directed toward the cover member 13. Therefore, the cover member 13 is prevented from being heated excessively. Accordingly, an operator who handles the optical fiber module 1 can be prevented from getting burnt when the operator touches the cover member 13.

In the present embodiment, each of the connection portions 284A and 284B of the heat dissipation portion 280 connects the edge of the lower surface of the holder 282 in the X-direction to the base plate 11. Nevertheless, the connection portions 284A and 284B may be connected to any location of the holder 282 as long as they connect the holder 282 and the base plate 11 to each other. The number of the connection portions 284A and 284B of the heat dissipation portion 280 is not limited to two.

Figure 11:
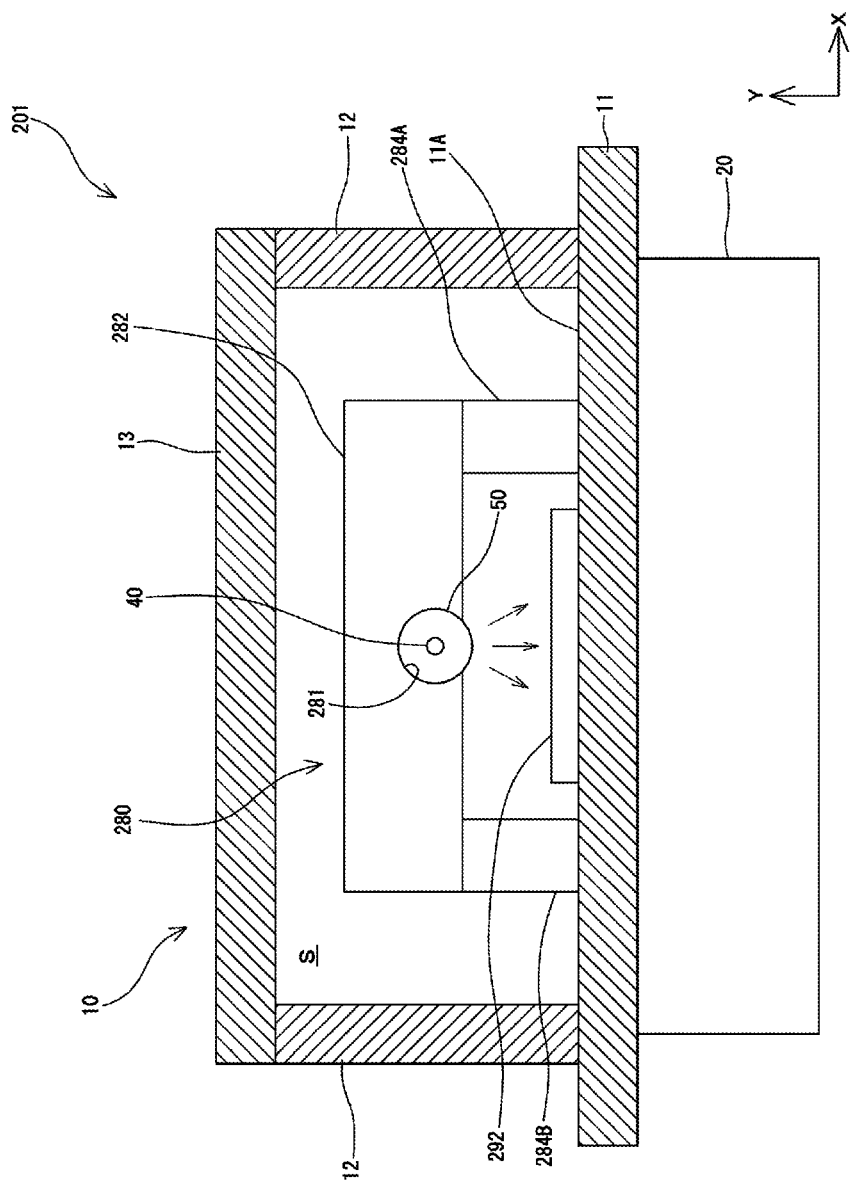
FIG. 11 is a schematic diagram showing another example of a heat dissipation portion in the optical fiber module shown in FIG. 10.

Furthermore, in the present embodiment, the upper half of the outer circumferential surface of the light scattering member 50 is covered with the holder 282 of the heat dissipation portion 280. A portion of the light scattering member 50 that is covered with the holder 282 may have any size as long as the leakage light can be scattered into the internal space S toward the base plate 11. For example, as shown in FIG. 11, the light scattering member 50 may be covered with the holder 282 such that only an area less than a half of the outer circumferential surface of the light scattering member 50 is exposed to the base plate 11.

Figure 12:
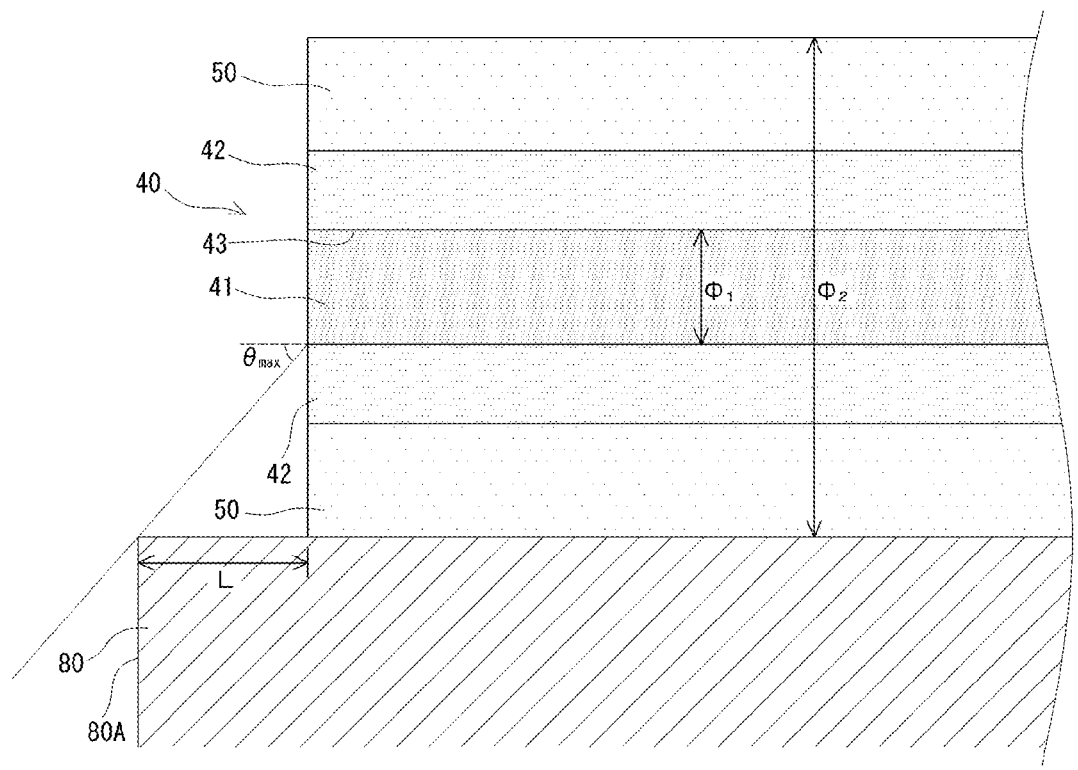
FIG. 12 is an enlarged cross-sectional view showing a projecting end of an optical fiber in an optical fiber module according to a fourth embodiment of the present invention.

FIG. 12 is an enlarged cross-sectional view showing a projecting end of an optical fiber in an optical fiber module according to a fourth embodiment of the present invention. In the present embodiment, the heat dissipation portion 80 of the aforementioned first embodiment is modified to project from the end surface 40A of the projecting end of the optical fiber 40 toward the internal space S in the Z-direction (in which the optical fiber 40 extends) by the length L. The length L is defined by the following equation (2):

$$L = \left(\frac{\phi_2 - \phi_1}{2}\right)\frac{1}{\tan\theta_{max}} \quad (2)$$

where $\phi_1$ is a diameter of the optical fiber 40 on the YZ cross-section, $\phi_2$ is a diameter of the light scattering member 50 on the YZ cross-section, and $\theta_{max}$ is the maximum acceptance angle of the optical fiber 40.

In the present embodiment, the heat dissipation portion 80 projects into the internal space S by the aforementioned length L as shown in FIG. 12. A laser beam directed to the optical fiber 40 with an angle of incidence that is greater than the maximum acceptance angle $\theta_{max}$ of the optical fiber 40 impinges on a side surface 80A of the heat dissipation portion 80. The laser beam that has impinged on the side surface 80A of the heat dissipation portion 80 is absorbed by the heat dissipation portion 80 or reflected from the side surface 80A of the heat dissipation portion 80 so that it reaches an inner surface of the package housing 10. The laser beam absorbed by the heat dissipation portion 80 is converted into heat therein. The converted heat is transferred to the heat sink 20 (see FIG. 1) through the base plate 11 (see FIG. 1) and dissipated to an outside of the optical fiber module through the heat sink 20. The laser beam reflected from the side surface 80A of the heat dissipation portion 80 reaches the inner surface of the package housing 10 that is located away from the end surface 40A of the projecting end of the optical fiber 40. Therefore, the power density of light converted into heat can be reduced.

In this manner, when the heat dissipation portion 80 projects from the end surface 40A of the projecting end of the optical fiber 40 by at least the aforementioned length L, a portion of the laser beam directed toward the optical fiber 40 with an angle of incidence that is greater than the maximum acceptance angle $\theta_{max}$ of the optical fiber 40 does not enter the optical fiber 40. Accordingly, the amount of leakage light produced within the optical fiber 40 can be reduced.

Such a configuration can be applied to the aforementioned second embodiment. Furthermore, in the aforementioned third embodiment, the holder 282 of the heat dissipation portion 280 may project from the end surface 40A of the projecting end of the optical fiber 40 into the internal space S in the Z-direction by at least the aforementioned length L.

In the aforementioned embodiment, a single semiconductor laser device 32 is arranged within the package housing 10. As a matter of course, however, a single semiconductor laser device 32 or a plurality of semiconductor laser devices 32 may be arranged within the package housing 10.

The terms "lower surface," "upper surface," "bottom," "upper portion," "upper half," "lower half," "below" and other positional terms used herein are shown with respect to the embodiments in the figures and may be varied depending on the relative positional relationship between components of the optical fiber module.

Although some preferred embodiments of the present invention have been described, the present invention is not limited to the aforementioned embodiments. It should be understood that various different forms may be applied to the present invention within the technical idea thereof.

INDUSTRIAL APPLICABILITY

The present invention is suitably used for an optical fiber module operable to output a laser beam emitted from a laser device to an outside thereof.

DESCRIPTION OF REFERENCE NUMERALS AND SIGNS 1 optical fiber module
10 package housing
11 base plate
11A upper surface
12 side wall
12A through hole
12B inner surface
13 cover member
13A lower surface
20 heat sink
31 mount
32 semiconductor laser device
40 optical fiber
40A end surface
41 core
42 cladding
50 light scattering member
60 fiber holder
71A, 71B lens support
72A, 72B lens
80 heat dissipation portion
81 groove
101 optical fiber module
190 reflection portion
191A, 191B reflective surface
192, 192A, 192B absorption portion
201 optical fiber module
280 heat dissipation portion
281 groove
282 holder
284A, 284B connection portion
292 absorption portion
S internal space

The invention claimed is:

1. An optical fiber module comprising:
a package housing having an internal space defined by a base plate, a side wall, and a cover member;
a laser device disposed on the base plate within the internal space;
an optical fiber that transmits a laser beam emitted from the laser device to an outside of the package housing, the optical fiber having a projecting end that projects from an inner surface of the side wall of the package housing toward the internal space;
a light scattering member that scatters light having a wavelength of the laser beam, the light scattering member covering an outer circumferential surface of the projecting end of the optical fiber; and
a heat dissipation portion disposed on the base plate, the heat dissipation portion holding at least part of the light scattering member,
wherein a cross-section of a portion of the heat dissipation portion that holds the light scattering member, on a cutting plane perpendicular to an axial direction of the optical fiber, includes a portion that surrounds and holds an outer circumferential surface of the light scattering member and a portion that exposes the outer circumferential surface of the light scattering member to the internal space.

2. The optical fiber module as recited in claim 1, wherein the portion of the outer circumferential surface of the light scattering member exposed to the internal space is exposed to the cover member of the package housing.

3. The optical fiber module as recited in claim 1, further comprising at least one reflection portion that reflects light scattered from the light scattering member.

4. The optical fiber module as recited in claim 3, wherein the reflection portion is configured to reflect the light scattered from the light scattering member toward the base plate of the package housing.

5. The optical fiber module as recited in claim 4, wherein a center of the reflection portion in an axial direction of the optical fiber and an end surface of the projecting end of the optical fiber are on a common plane perpendicular to the axial direction of the optical fiber.

6. The optical fiber module as recited in claim 4, wherein at least one cross-section of the reflection portion on a cutting plane perpendicular to the axial direction of the optical fiber has a bilateral symmetrical shape,
wherein the bilateral symmetrical shape has a symmetrical axis that passes through a center of an axis of the optical fiber on the cutting plane of the reflection portion.

7. The optical fiber module as recited in claim 3, further comprising at least one absorption portion that absorbs light reflected by the reflection portion.

8. The optical fiber module as recited in claim 1, wherein the portion of the outer circumferential surface of the light scattering member exposed to the internal space is exposed to the base plate of the package housing.

9. The optical fiber module as recited in claim 8, wherein the heat dissipation portion includes:
a holder that holds the light scattering member, and
a connection portion that connects the holder and the base plate to each other,
wherein a cross-section of the holder on a cutting plane perpendicular to the axial direction of the optical fiber includes a portion near the cover member that covers the portion of the outer circumferential surface of the light scattering member and a portion near the base plate that exposes the portion of the outer circumferential surface of the light scattering member to the base plate.

10. The optical fiber module as recited in claim 8, further comprising at least one absorption portion that absorbs light scattered from the light scattering member.

11. The optical fiber module as recited in claim 1, wherein the heat dissipation portion projects from the end surface of the projecting end toward the internal space in a direction in which the optical fiber extends by at least a length L that meets an equation:

$$L = \left(\frac{\phi_2 - \phi_1}{2}\right)\frac{1}{\tan\theta_{max}}$$

where $\phi_1$ is a diameter of a core of the optical fiber, $\phi_2$ is a diameter of the light scattering member, and $\theta_{max}$ is a maximum acceptance angle of the optical fiber.

12. The optical fiber module as recited in claim 1, wherein the base plate is connected to a heat sink.

13. The optical fiber module as recited in claim 1, wherein the projecting end includes an axial end of the optical fiber that faces the laser device.

14. The optical fiber module as recited in claim 1, wherein the portion of the heat dissipation portion that covers the outer circumferential surface of the light scattering member contacts the outer circumferential surface of the light scattering member to transfer heat from the light scattering member to the heat dissipation portion.

* * * * *